United States Patent
Shao et al.

(10) Patent No.: US 10,141,291 B2
(45) Date of Patent: Nov. 27, 2018

(54) SEMICONDUCTOR DEVICE AND METHOD OF MANUFACTURING THE SAME

(71) Applicant: TAIWAN SEMICONDUCTOR MANUFACTURING COMPANY LTD., Hsinchu (TW)

(72) Inventors: Tung-Liang Shao, Hsinchu (TW); Chih-Hang Tung, Hsinchu (TW); Chen-Hua Yu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/954,416

(22) Filed: Nov. 30, 2015

(65) Prior Publication Data

US 2017/0154881 A1 Jun. 1, 2017

(51) Int. Cl.
| | | |
|---|---|---|
| *H01L 21/78* | (2006.01) | |
| *H01L 25/18* | (2006.01) | |
| *H01L 21/02* | (2006.01) | |
| *H01L 21/683* | (2006.01) | |
| *H01L 21/768* | (2006.01) | |
| *H01L 23/522* | (2006.01) | |
| *H01L 23/00* | (2006.01) | |
| *H01L 25/065* | (2006.01) | |
| *H01L 25/00* | (2006.01) | |

(52) U.S. Cl.
CPC ........ *H01L 25/18* (2013.01); *H01L 21/02282* (2013.01); *H01L 21/6835* (2013.01); *H01L 21/76802* (2013.01); *H01L 21/76877* (2013.01); *H01L 21/76898* (2013.01); *H01L 21/78* (2013.01); *H01L 23/5226* (2013.01); *H01L 24/11* (2013.01); *H01L 25/0652* (2013.01); *H01L 25/0655* (2013.01); *H01L 25/50* (2013.01); *H01L 2221/68327* (2013.01); *H01L 2224/0401* (2013.01); *H01L 2225/06541* (2013.01); *H01L 2225/06548* (2013.01)

(58) Field of Classification Search
CPC .......... H01L 21/02282; H01L 21/6835; H01L 21/76802; H01L 21/76877; H01L 21/76898; H01L 21/78; H01L 23/5226; H01L 24/11
See application file for complete search history.

(56) References Cited

U.S. PATENT DOCUMENTS

| | | | | |
|---|---|---|---|---|
| 2011/0204505 A1* | 8/2011 | Pagaila | ................. | H01L 21/568 257/686 |
| 2012/0098123 A1* | 4/2012 | Yu | ....................... | H01L 21/563 257/737 |

(Continued)

*Primary Examiner* — Whitney T Moore
*Assistant Examiner* — Joseph Galvin, III
(74) *Attorney, Agent, or Firm* — WPAT, P.C., Intellectual Property Attorneys; Anthony King

(57) ABSTRACT

The present disclosure relates to a semiconductor device and method of manufacturing the same. The method for manufacturing a semiconductor device includes: attaching a carrier wafer to a front side of a top die wafer; thinning a back side of the top die wafer, the back side of the top die wafer being opposite to the front side the top die wafer; singulating the carrier wafer and the top die wafer whereby singulated dies attached to singulated carrier dies are formed; and bonding back side of each of the singulated dies to a front side of a bottom die wafer.

20 Claims, 20 Drawing Sheets

(56) References Cited

U.S. PATENT DOCUMENTS

| | | | |
|---|---|---|---|
| 2012/0153468 A1* | 6/2012 | Lee | H01L 23/13 257/737 |
| 2013/0040423 A1* | 2/2013 | Tung | H01L 23/3114 438/107 |
| 2013/0105966 A1* | 5/2013 | Kelkar | H01L 24/19 257/737 |
| 2014/0091454 A1* | 4/2014 | Lin | H01L 24/19 257/734 |
| 2015/0093880 A1* | 4/2015 | Ji | H01L 21/02013 438/459 |
| 2015/0243575 A1* | 8/2015 | Strothmann | H01L 23/3114 257/773 |
| 2016/0300817 A1* | 10/2016 | Do | H01L 25/50 |

* cited by examiner

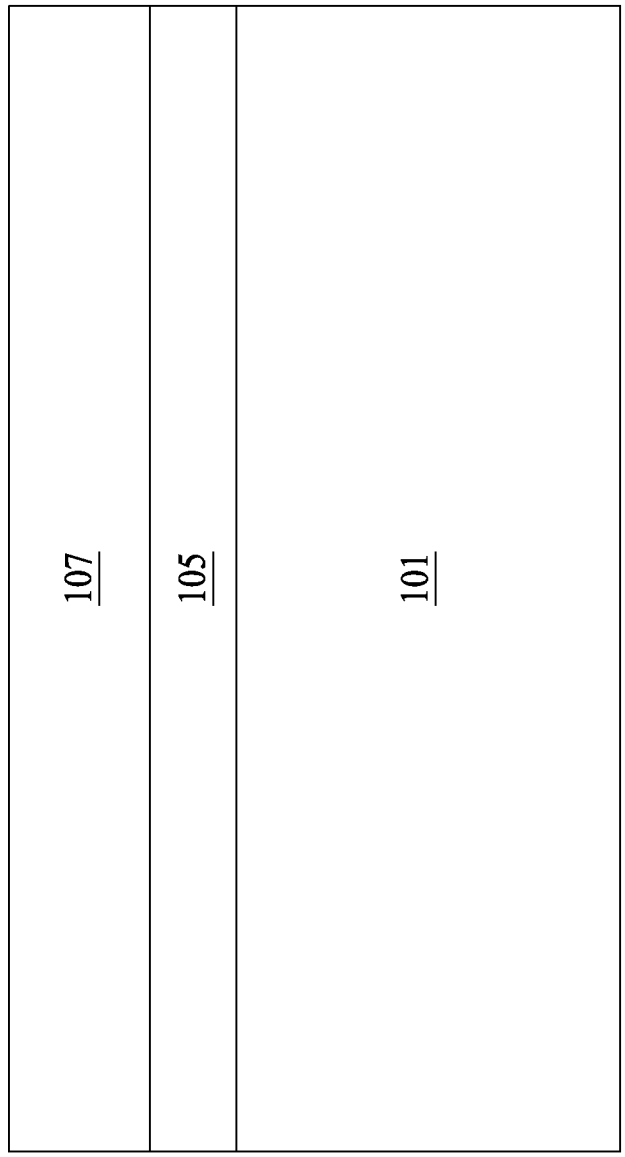

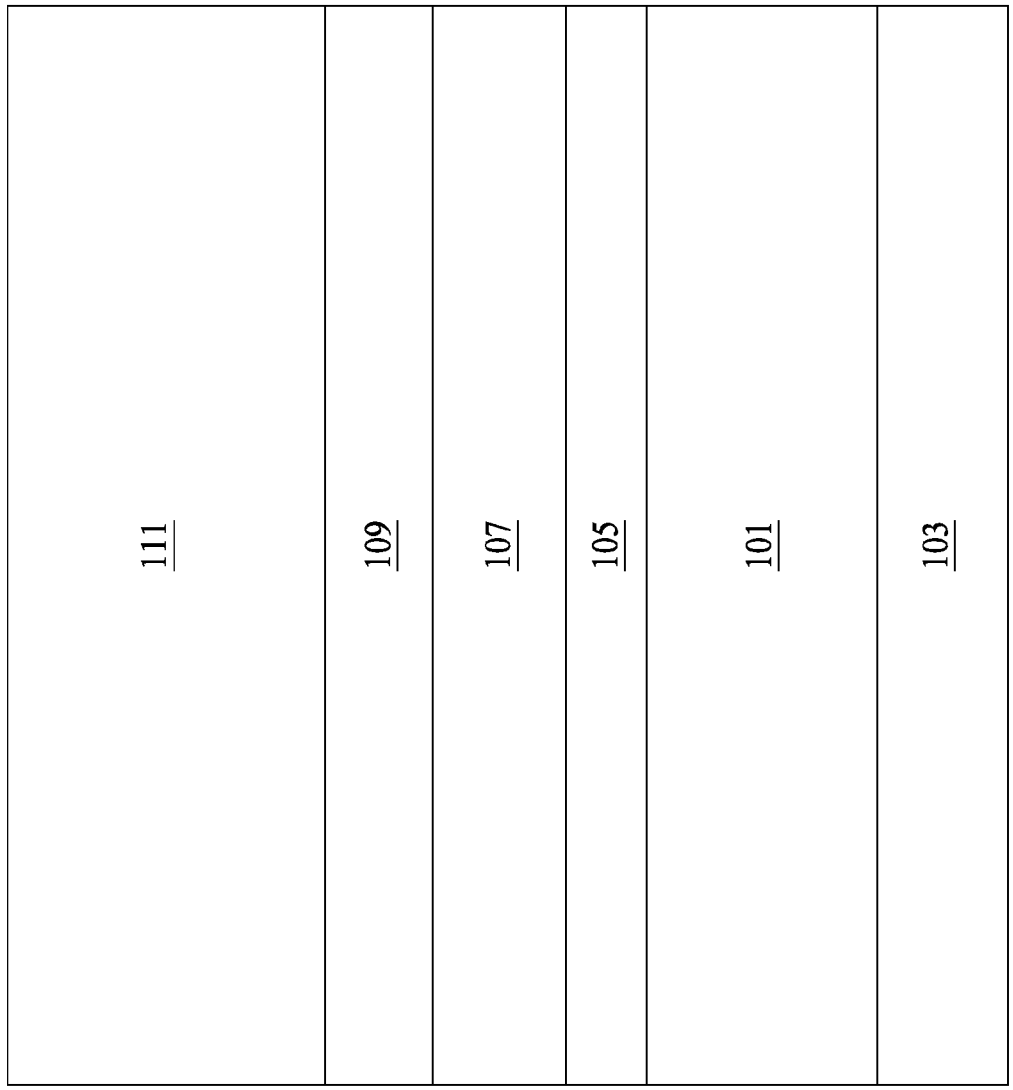

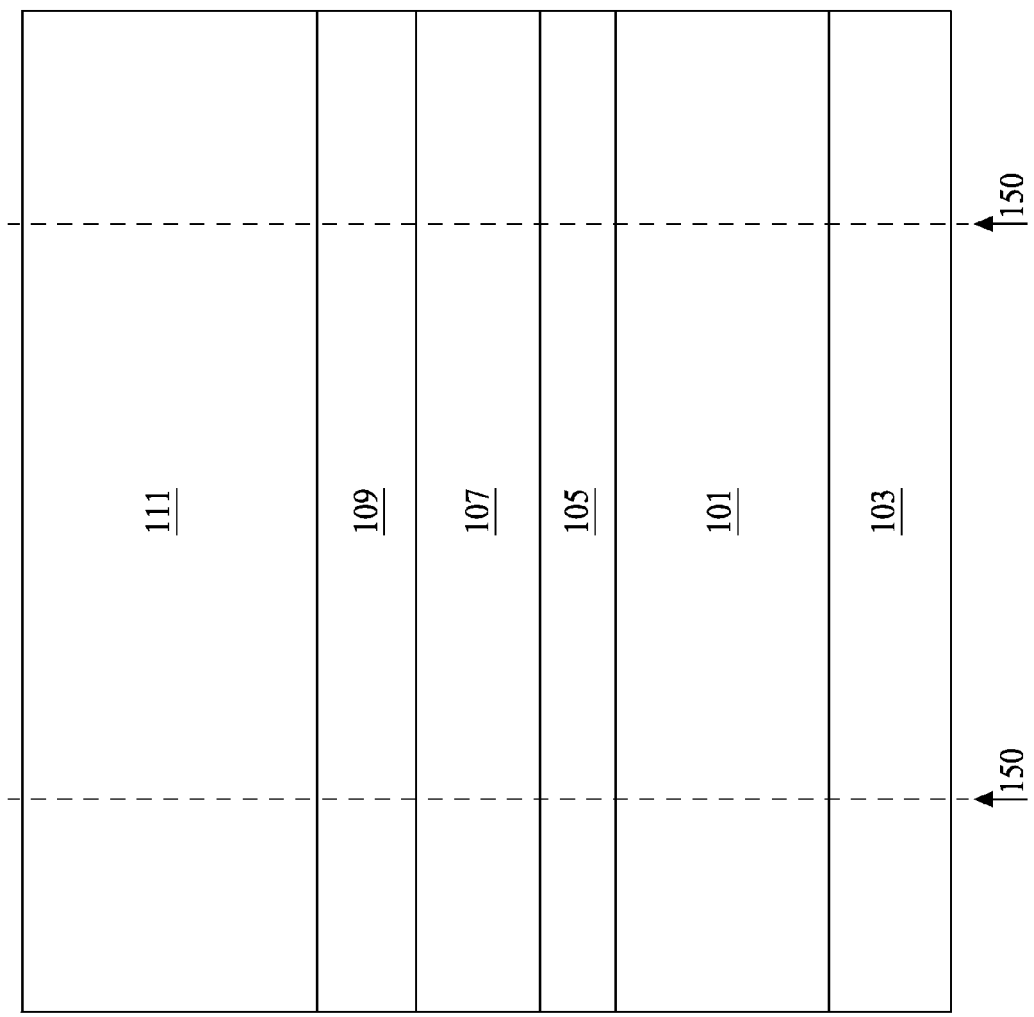

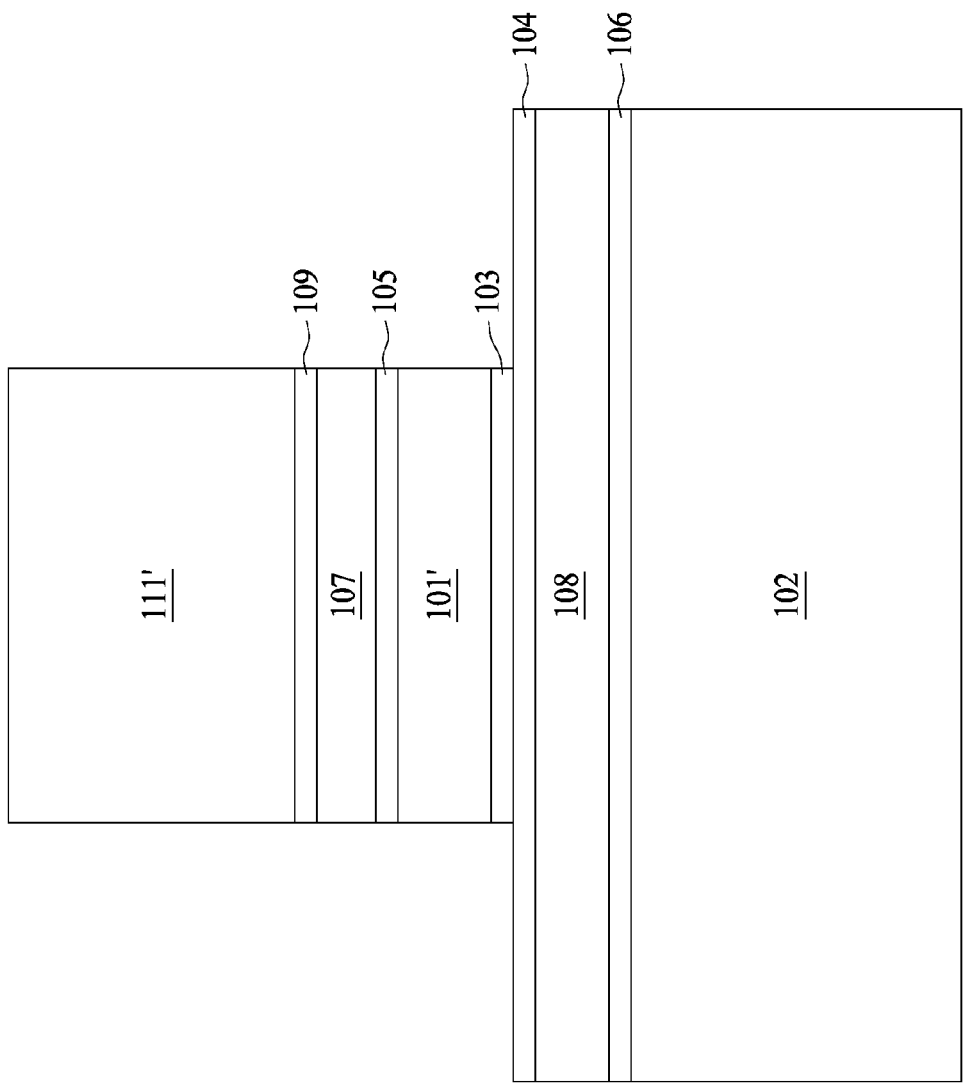

SEMICONDUCTOR DEVICE AND METHOD OF MANUFACTURING THE SAME

BACKGROUND

Various semiconductor devices are manufactured through a wafer process and a packaging process. A substrate, usually a silicon wafer, is masked, etched, and doped through several process steps, the steps depending on the type of devices being manufactured.

Generally, a method that stacks the wafers before dicing the wafers and thereby performs dicing after stacking (Wafer to Wafer method, hereafter called "W2W method"). The W2W method yields high manufacturing efficiency, but has a disadvantage that, when defect rate in each of the wafers increases, the defect rate rises cumulatively with increasing number of stacked wafers, thereby leading to a fall in product yield and rise in final product cost.

Thus, there is a need to provide a method for manufacturing wafer stacking which may obtain high product yield and reduce product cost. It is also to be appreciated that while three dimension package applications are discloses, there can be numerous different dies attached in a multi-chip package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1H illustrate fragmental cross sectional views of operations for bonding semiconductor devices in accordance with some embodiments of the present disclosure.

DETAILED DESCRIPTION

Figure 1B:
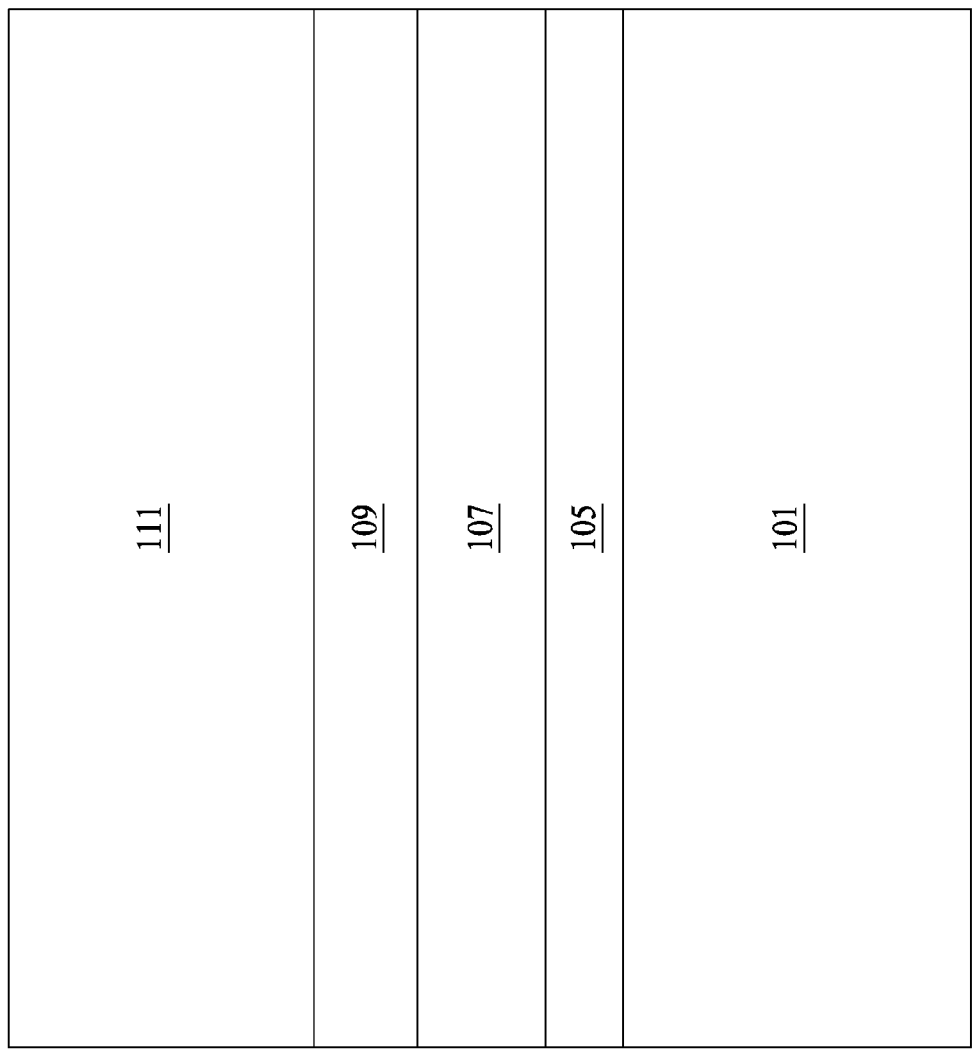

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As known in the art, a wafer is processed in a manner to create a plurality of individual dies from the wafer, and different wafers can have different properties. Disclosed embodiments include methods for bonding at least one singulated die to the top semiconductor surface of a wafer and the bonded semiconductor structures formed by the aforesaid methods. The singulated dies may be different in functions and properties. In addition, circuit formed on the top semiconductor surface of the wafer generally includes circuit elements such as transistors, capacitors, resistors, and diodes, as well as signal lines and other conductors that interconnect these various circuit elements. Regarding the structure of die-wafer stack, known good dies (KGDs) may be advantageously employed for producing multi-chip packages and for producing better yield as compared with those structures fabricated by W2W method. In addition, heterogeneous devices or chips with different sizes may be integrated for various functions in one package.

FIG. 1A depicts a top die wafer 101 including a front-end-of-line (FEOL) layer 105 and a back-end-of-line (BEOL) layer 107. The BEOL layer 107 includes multiple layers of interconnects therein fabricated by the BEOL operation and is above the FEOL layer 105. The FEOL layer 105 includes devices, such as transistors, therein fabricated with the FEOL operation. The un-grinded top die wafer 101 is around 31 mil (around 700 micrometer) in thickness.

FIG. 1B further depicts a temporary bond 109 and a carrier wafer 111. The carrier wafer 111 possesses a planar surface in order to accommodate the top die wafer 101. In some embodiments, the carrier wafer 111 is first coated with a temporary bond 109. The coating can take place by all known coating methods. Preferably, the coating can be an adhesive tape or a die-attached film (DAF). The coating can also be a dielectric layer formed by physical vapor deposition (PVD) or chemical vapor deposition (CVD). The thickness of the temporary bond 109 depends on different parameters, but is between 1 nm and 1 mm, preferably between 10 nm and 100 μm, more preferably between 100 nm and 10 μm, most preferably between 1 μm and 5 μm. The carrier wafer 111 is mounted onto the BEOL layer 107 via the temporary bond 109. The carrier wafer 111 may be formed of glass, silicon, glass ceramics, quartz, silicon oxide, aluminum oxide, polymer, plastic, or the like. The carrier wafer 111 is understood to mean a substrate that will be adhered temporarily to the top die wafer 101 in order to provide mechanical support and that may be subjected to manufacturing treatments. The carrier wafer 111 may carry completed or partially completed top die wafer 101 and transfer them to a host substrate. The expression "host substrate" is understood to mean a substrate intended to receive (typically by a transfer operation described above) processed devices.

The thinning of the back side of the top dies wafer 101 and the transferring of the top dies wafer 101 cannot be handled without mechanical support, the top die wafer 101 is joined to the carrier wafer 111. Otherwise, a small thickness (for example, below 200 μm) of the top die wafer 101 may be damaged without the carrier wafer 111.

Figure 1C:
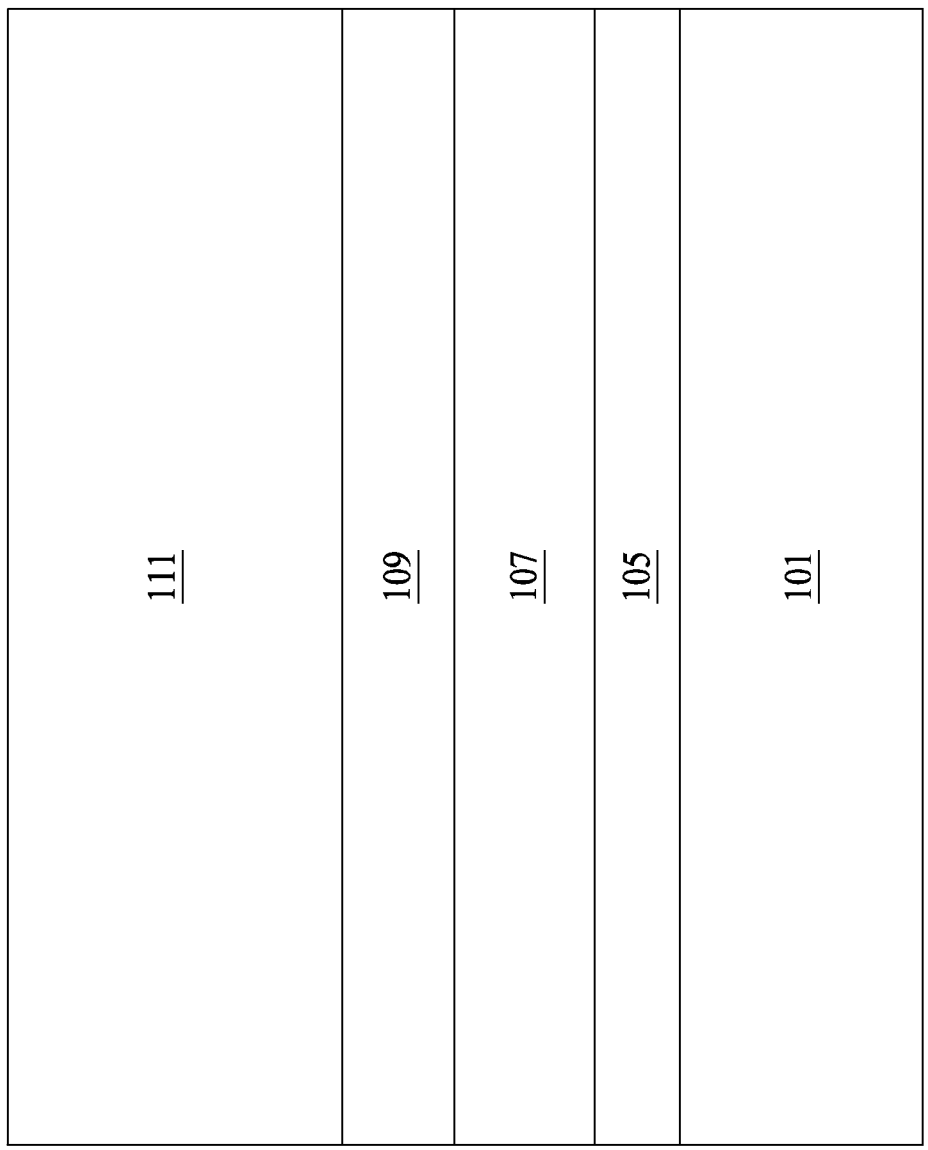

FIG. 1C further illustrates that after the top die wafer 101 being attached to the carrier wafer 111, the thickness of the top die wafer 101 may be thinned from 700 μm to below 25 μm, for example. Wafer thinning is usually performed via backside grinding and/or chemical mechanical polishing (CMP) of a semiconductor wafer. For example, CMP involves the carrier wafer 111 carrying the top die wafer 101 and bringing the back surface of the top die wafer 101 into contact with a hard and flat rotating horizontal platter in the presence of liquid slurry. The slurry usually contains abrasive powders, such as diamond or silicon carbide, along with chemical etchants such as ammonia, fluoride, or combinations thereof. The abrasives thins the back side of the top die wafer 101 while the etchants polish the back side of the top die wafer 101 at the submicron level. The top die wafer 101 is maintained in contact with the abrasives until a target thickness of the top die wafer 101 is achieved.

FIG. 1D further illustrates that the back side of the thinned top die wafer 101 is attached to a dielectric layer 103 or a solid form dielectric die attach film (DAF) 103, such as a fully cured epoxy. The dielectric layer 103 may be formed by a variety of known techniques for forming such layers, e.g., CVD, low-pressure CVD (LPCVD), plasma-enhanced CVD (PECVD), sputtering and PVD, thermal growing, and the like. The dielectric layer 103 may have a thickness ranging from 2 to 7K Å, and may be formed from a combination of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), silicon nitride (SiN), silicon nitricarbide (SiCN), and the like.

FIG. 1E further illustrates that the thinned top die wafer 101 with the dielectric layer 103, the FEOL layer 105, the BEOL layer 107, the temporary bond 109, and the carrier wafer 111 is singulated so that a plurality of top dies 101' supported by the carrier die 111' are formed. In other words, each of the top dies 101' is supported by the carrier die 111' that has substantially the same size as the top die 101' in a top view. Since multiple dies are respectively singulated, KGDs may be selected through die test for the subsequent processing. For example, a die test is performed to distinguish the good ones from the bad ones before bonding singulated dies to a host substrate, and only KGDs may be selected to bond to the host substrate. This prevents bad dies from devised in a multi-chip package. As a result, the yield of the final semiconductor package can be improved and numerous different singulated dies can be integrated in a multi-chip package.

FIG. 1E also illustrates the sawing direction 150 regarding the thinned top die wafer 101 with the dielectric layer 103, the FEOL layer 105, the BEOL layer 107, the temporary bond 109, and the carrier wafer 111 (hereinafter the "wafer stack") in a die saw operation. Conventionally a wafer stack without the carrier wafer 111 and temporary bond 109 is sawed from the front side of the wafer, consequently, "back side chipping" can be observed. "Back side chipping" may reduce the mechanical strength at the edge of the dies and can cause problems with subsequent assembly operations. In the present disclosure, sawing the wafer stack from the back side of the thinned top die wafer 101 along the sawing direction 150 is adopted. As a result, "back side chipping" cannot be observed. Additionally, because the thickness of the top die wafer 101 is in a range of below 25 μm, the carrier wafer 111 is required to carry the thinned top die wafer 101 for subsequent operations.

FIG. 1F further shows a bottom wafer 102 including a redistribution layer 108. In some embodiments, the bottom wafer 102 further includes a FEOL layer 106 that includes devices, such as transistors, fabricated with the FEOL operation. In some embodiments, the bottom wafer 102 is an interposer, which does not include active devices and may include through vias through the interposer. The redistribution layer 108 includes multiple layers of interconnects fabricated by the BEOL operation. A dielectric layer 104 or a solid form dielectric DAF 104 is disposed on the redistribution layer 108. The dielectric layer 104 may be formed by a variety of known techniques for forming such layers, e.g., CVD, LPCVD, PECVD, sputtering and PVD, thermal growing, and the like. The dielectric layer 104 may have a thickness ranging from 2 to 7K Å, for example, and may be formed from a combination of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), silicon nitride (SiN), silicon nitricarbide (SiCN), and the like. The FEOL layer 106, redistribution layer 108, and dielectric layer 104 are located on the front side of the bottom wafer 102.

FIG. 1F also illustrates that a singulated top die is formed after the singulation operation shown in FIG. 1E. In some embodiments, a plurality of singulated top dies can be devised over the front side of the bottom wafer 102. As noted above, the plurality of singulated top dies can be of different types of semiconductor dies and are selected to be KGDs. The singulated top die 101', which is a KGD, is then bonded to the front side of the bottom wafer 102. The dielectric layer 103 at the back side of the singulated top die 101' and the dielectric layer 104 at the front side of the bottom wafer 102 are directly connected. In other words, the back side of the singulated top die 101' is faced with the front side of the bottom wafer 102.

Figure 1G:
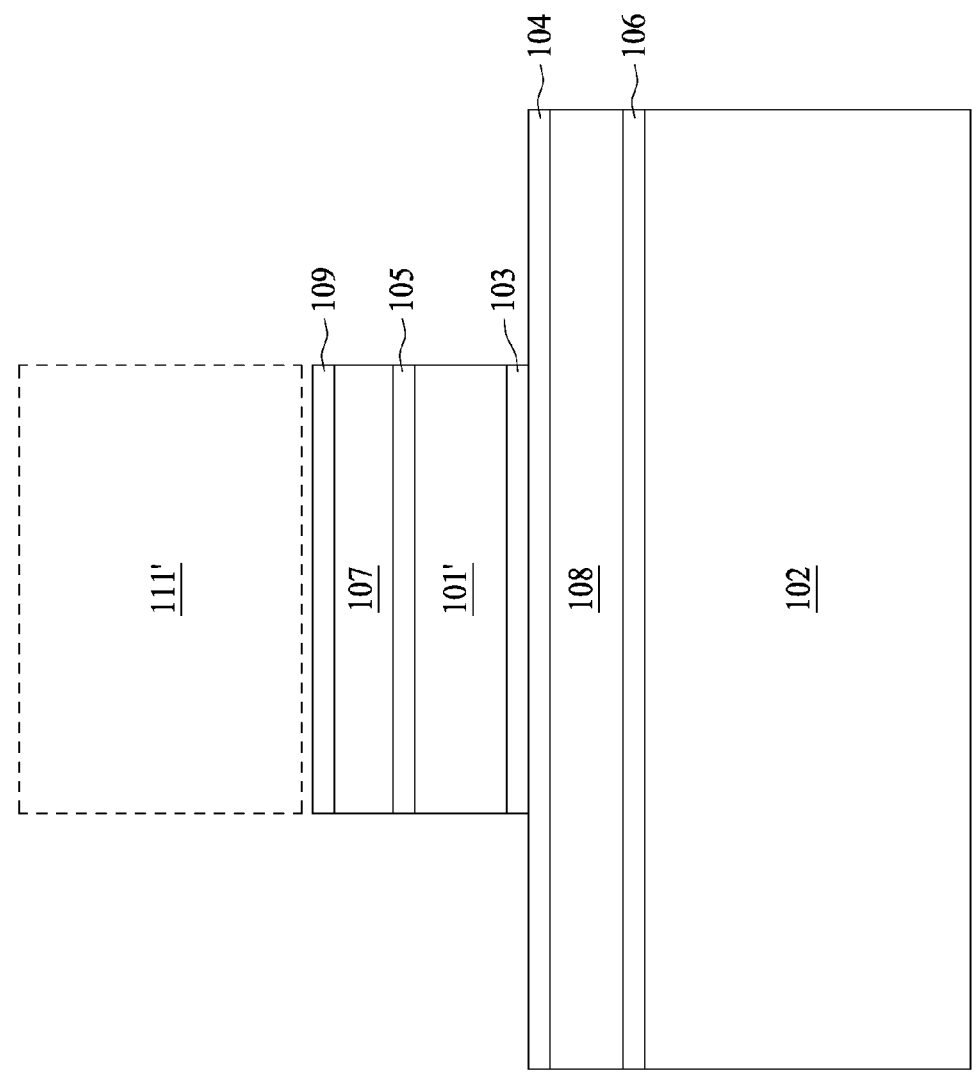

FIG. 1G further illustrates after bonding the singulated top die 101' to the bottom wafer 102, the singulated carrier die 111' is de-bonded from the temporary bond 109 at an elevated temperature and with special tools and techniques. For example, a laser beam may be scanned over the singulated carrier die 111', the laser beam causes the separation of the singulated carrier die 111' along the temporary bond 109 and the singulated carrier die 111' is mechanically lifted away from the singulated top die 101'. The laser is not strong enough to damage any structures of the semiconductor devices of the singulated top die 101' and the bottom wafer 102.

Figure 1H:
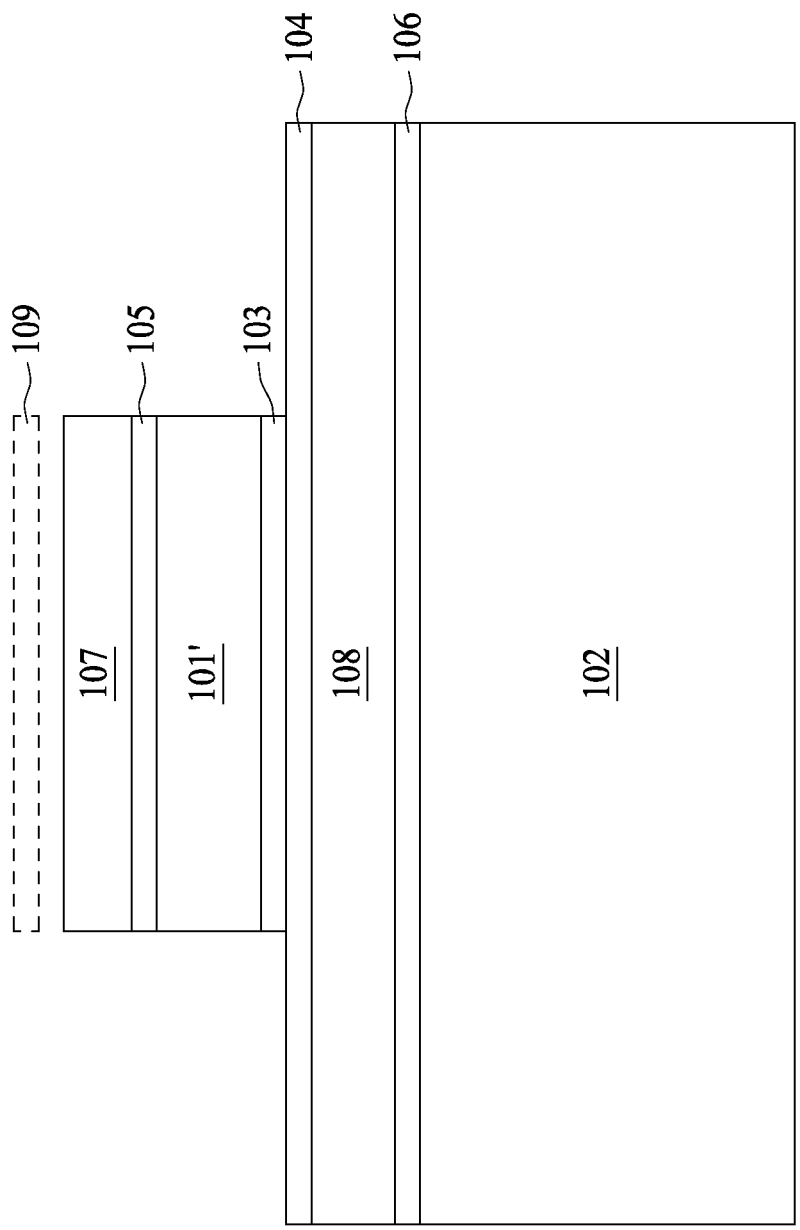

FIG. 1H further illustrates the temporary bond 109 is removed from the singulated top die 101'. For example, after the removal of the singulated carrier die 111', the temporary bond 109 may be dissolved with solvents such as detachment agents, acting chemically, preferably selectively on the temporary bond 109. Then, a wafer clean operation is performed to remove residual temporary bond 109 and clean the front side of the singulated top die 101' and the front side of the bottom wafer 102. Accordingly, the external contacts of the BEOL layer 107 of the singulated top die 101' for bonding to electrical terminals are exposed.

Figure 2A:
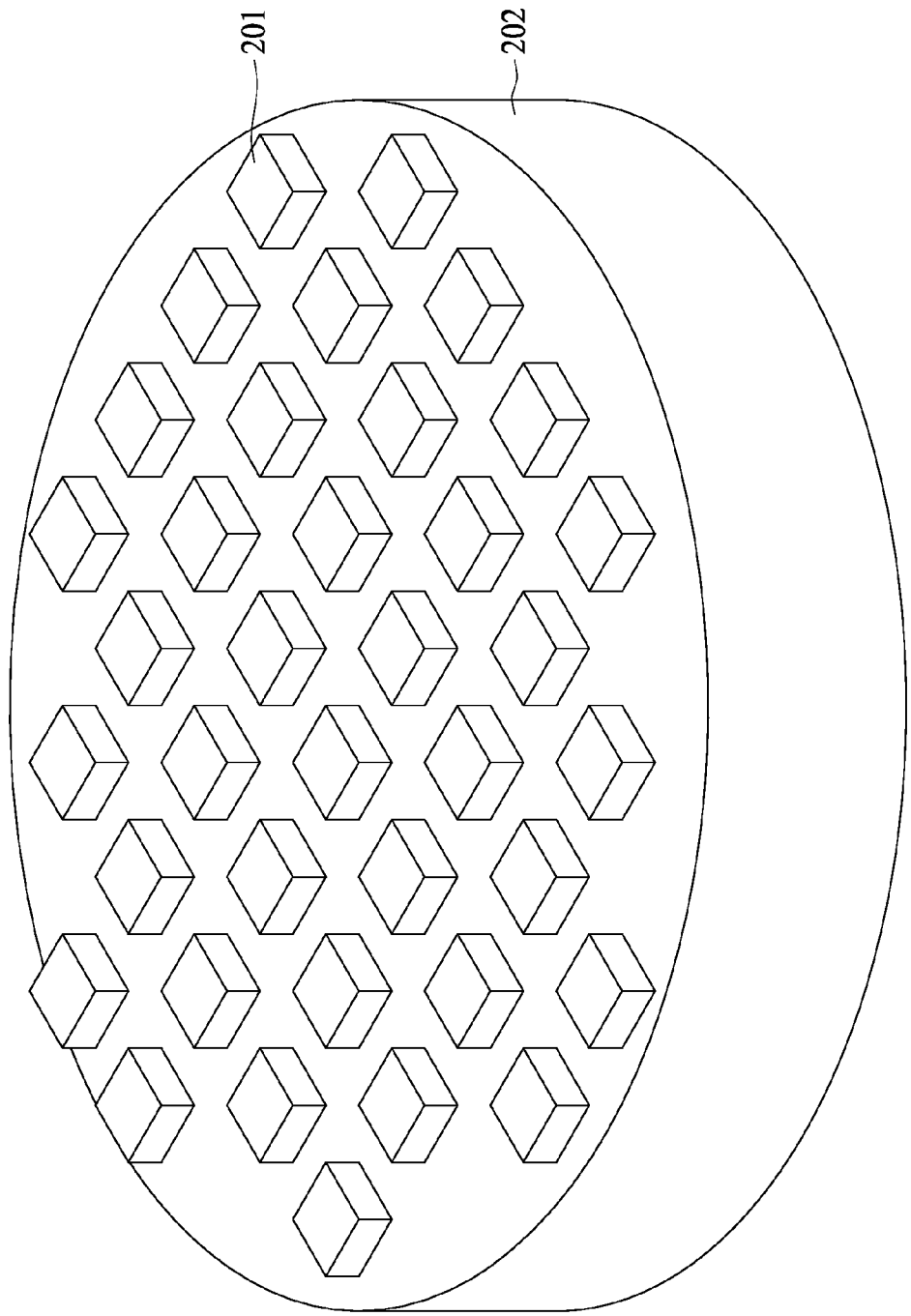
FIGS. 2A-2F illustrate perspective and cross sectional views of semiconductor manufacturing operations, in accordance with the some embodiments of the present disclosure.
Figure 2B:
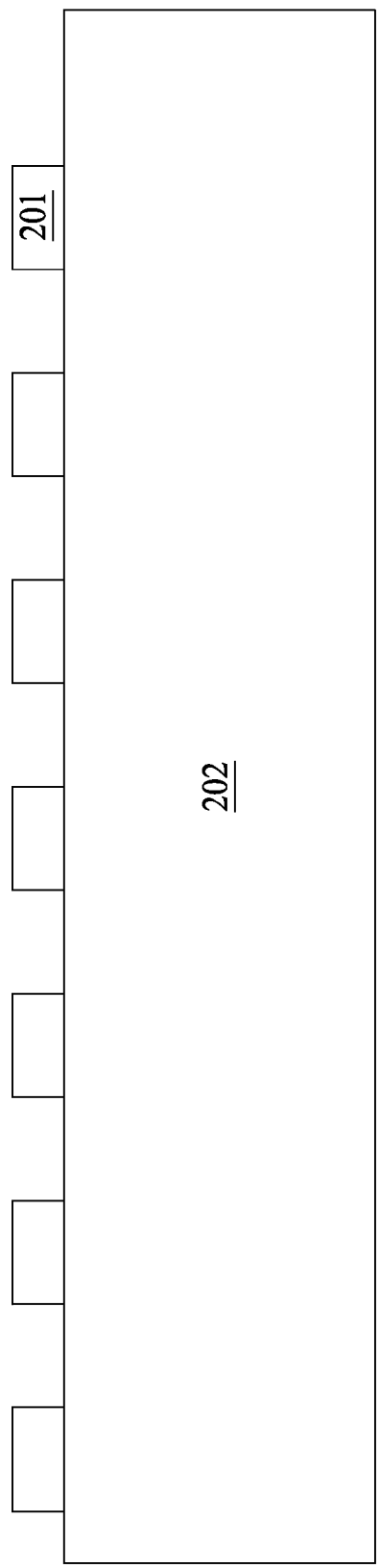

FIGS. 2A and 2B depict a bottom wafer 202 and multiple singulated top dies 201. The singulated top dies 201 are disposed on a front side of the bottom wafer 202, wherein the back sides of the singulated top dies 201 are faced with the front side of the bottom wafer 202. After testing and selection operations, the singulated top dies 201 are KGDs which may be identical type or different types of dies.

Figure 2C:
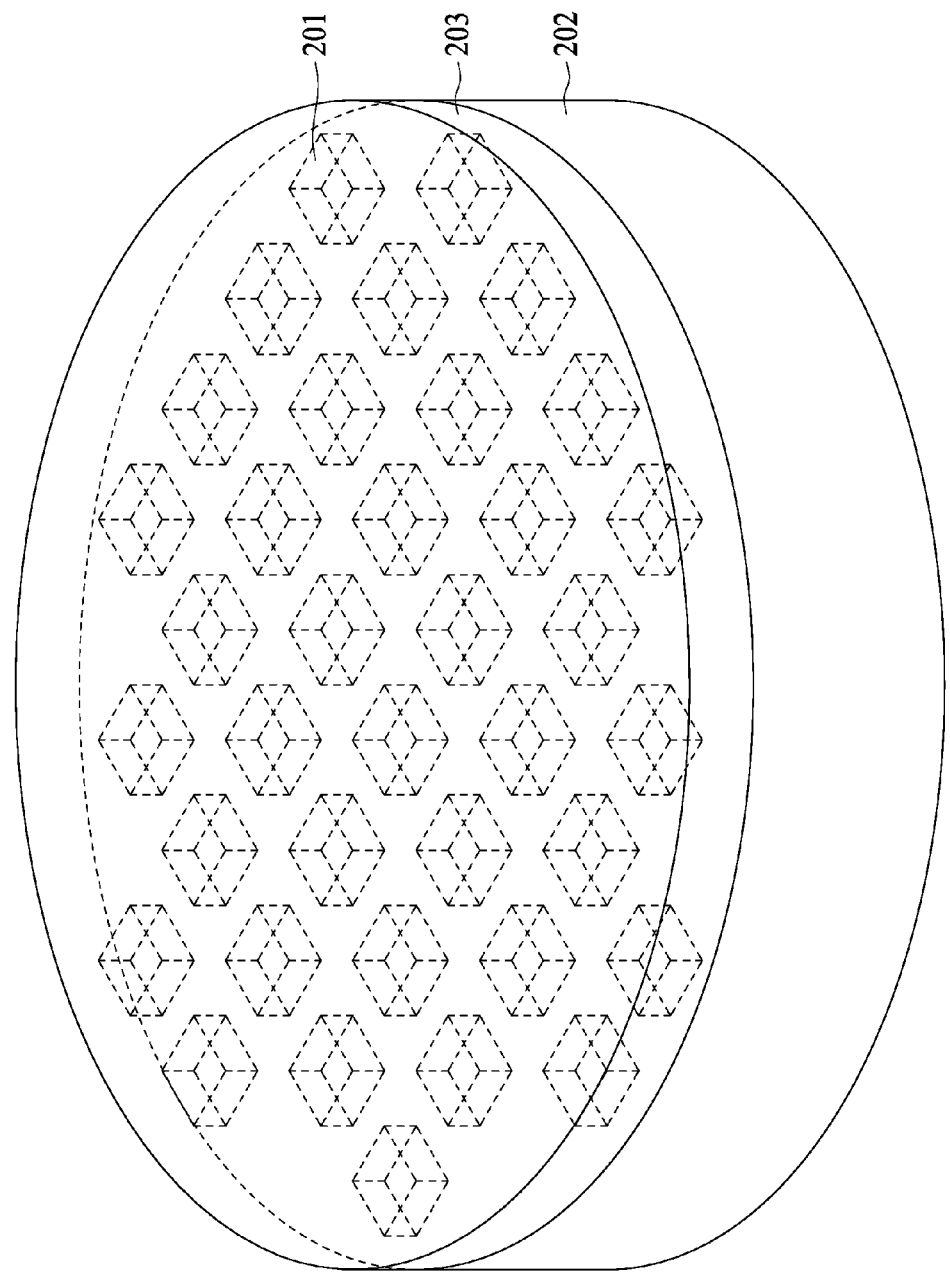
Figure 2D:
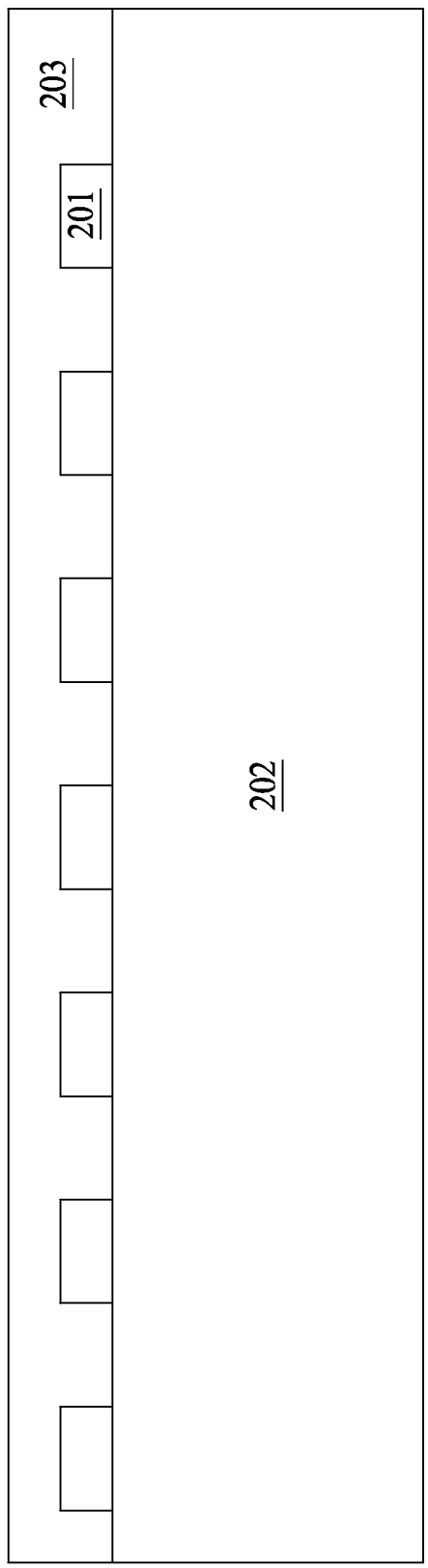

FIGS. 2C and 2D depict that a dielectric layer 203 is disposed on the front side of the plurality of top dies 201 and the front side of the bottom wafer 202. The dielectric layer 203 may be disposed by a spin-on operation. Spin-on glasses and spin-on polymers such as siloxanes, silicates, silazanes or silisequioxanes generally have good gap-fill properties. The dielectric layer 203 is typically formed by applying coating solution containing the polymers followed by a thermal cure operation. The thermal cure operation is performed to complete the formation of chemical bonds, outgas residual components, and reduce the dielectric constant in the dielectric layer 203. The thermal cure operation is performed in a furnace when using a batch mode or on a hotplate when using a single wafer mode. The dielectric layer 203 may be also formed by a variety of known techniques for forming such layers, e.g., CVD, LPCVD, PECVD, sputtering and PVD, thermal growing, and the like. The dielectric layer 203 may be formed from a combination of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), silicon nitride (SiN), silicon nitricarbide (SiCN), and the like. In some embodiments, a thickness of the dielectric layer 203 shall be greater than a thickness of the top dies 201. For example, a thickness of the dielectric layer 203 can be in a range of from about 0.5 um to about 40 um depending on the actual value of the top die 201.

Figure 2E:
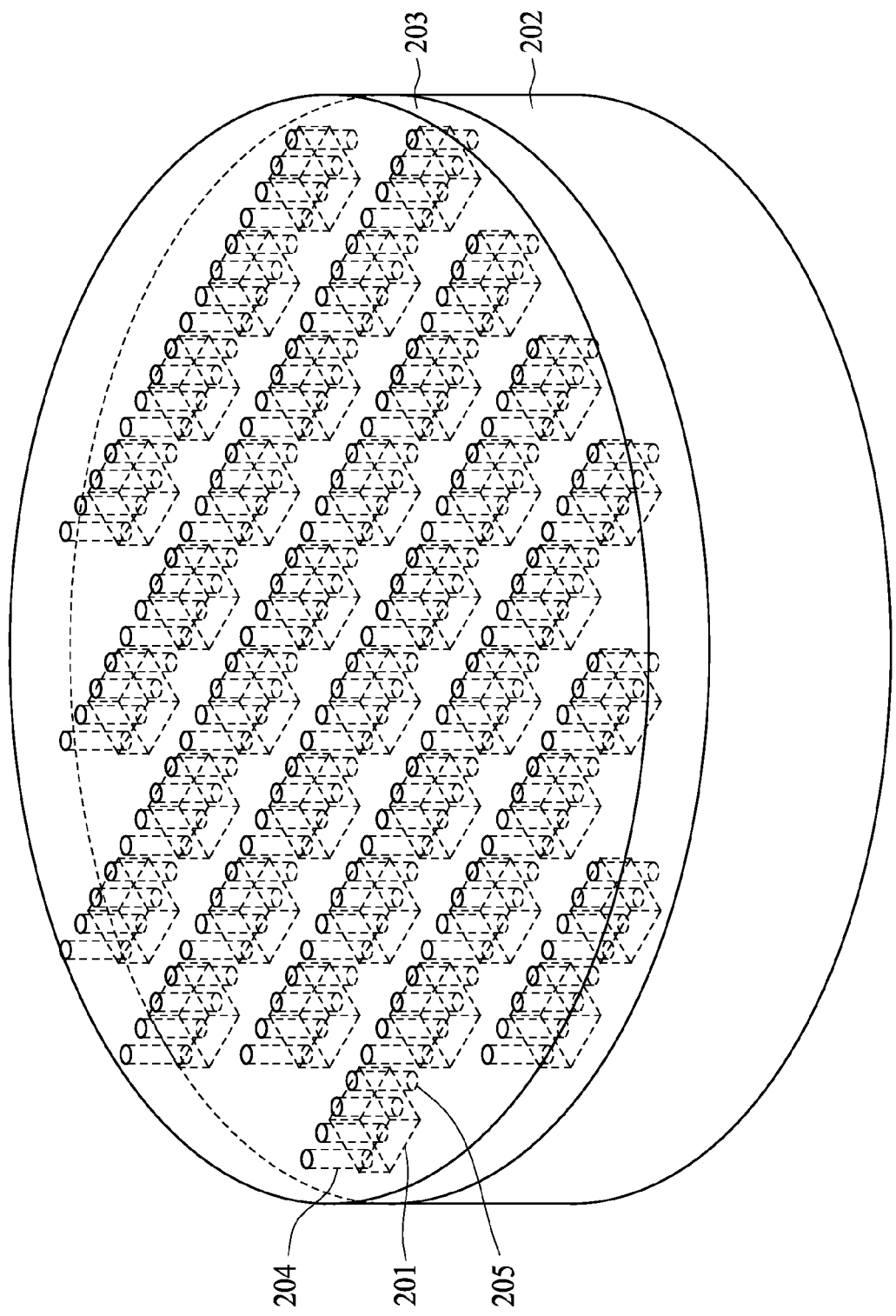
Figure 2F:
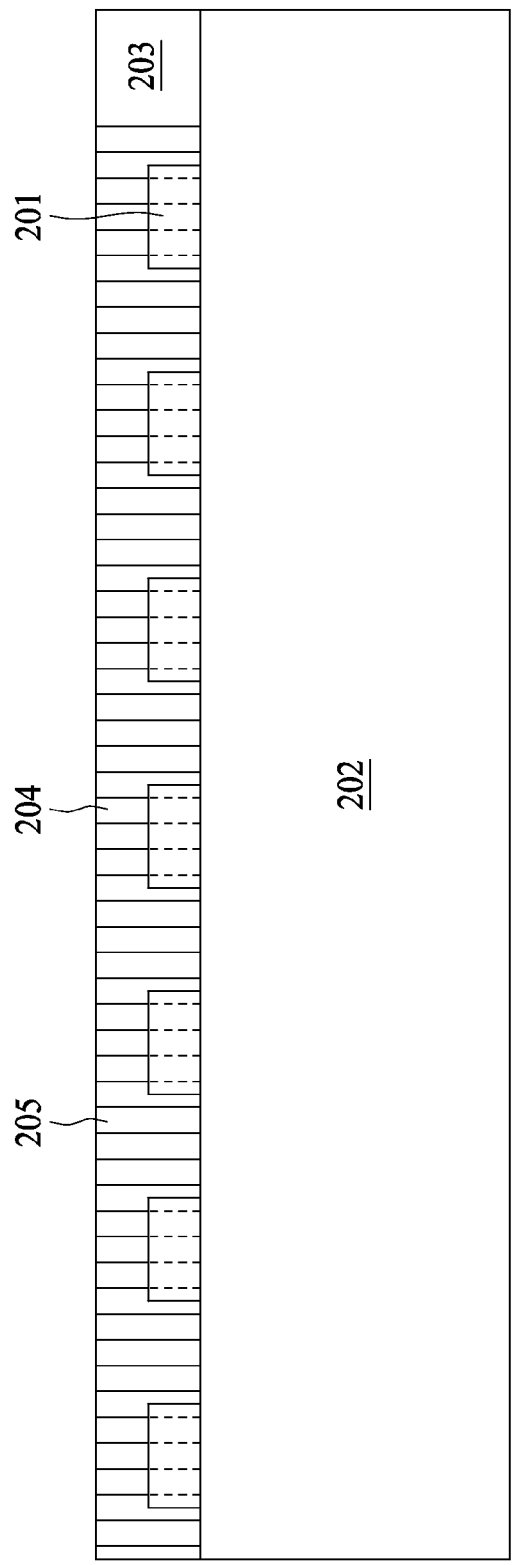

FIGS. 2E and 2F depict that through silicon vias (TSVs) 204 and through dielectric vias (TDVs) 205 are formed in the dielectric layer 203 by single or multiple etching operations. In some embodiments, the TSVs 204 have at least a portion penetrating through the top die 201. In some embodiments, only TSVs 204 are formed in the dielectric layer 203. In other embodiments, only TDVs 205 are formed in the dielectric layer 203. The TSVs 204 and/or the TDVs 205 are filled with electrically conductive material in order to electrically connect the singulated top dies 201 and the bottom wafer 202. The conductive material can be a metal, a metal compound such as metal silicide, or a doped semiconductor material that can provide desired conductivity for the interconnect structure. Either of the above connection allows the front side of the singulated top die 201 to be electrically coupled to the front side of the bottom wafer 202.

Figure 3A:
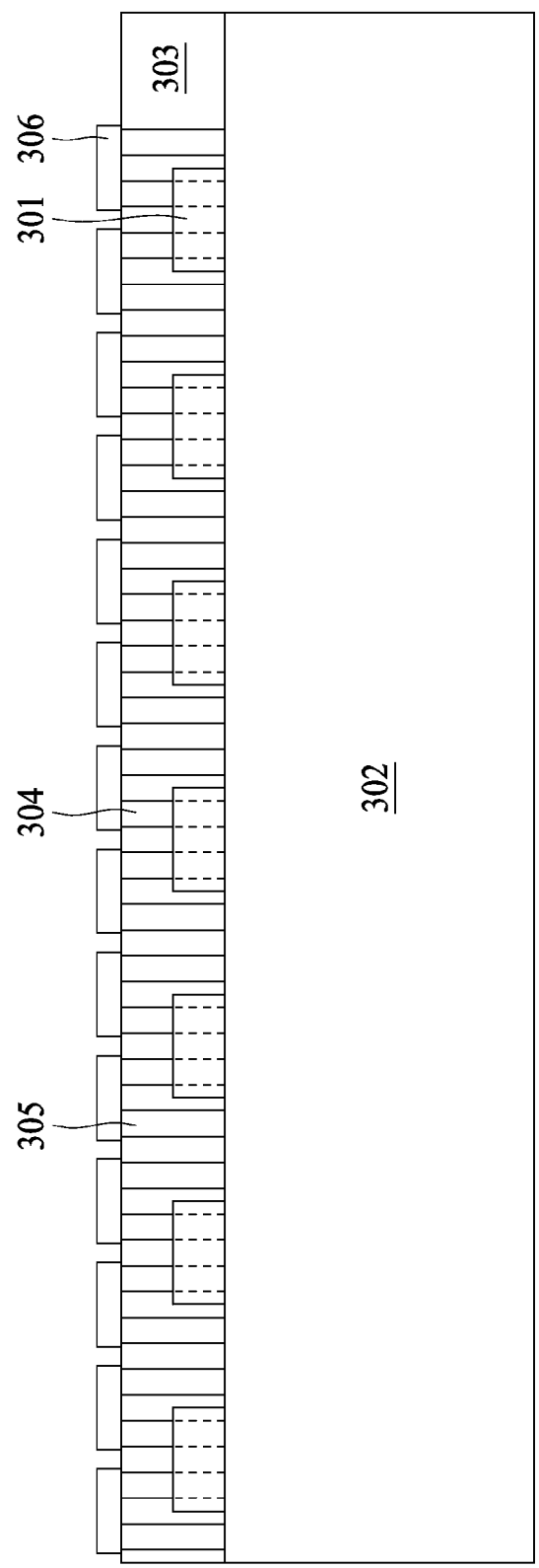
FIGS. 3A-3C illustrate cross sectional views of semiconductor manufacturing operations, in accordance with some embodiments of the present disclosure.

FIG. 3A illustrates that an electrically conductive layer or a redistribution layer (RDL) 306 is formed over the surface of the dielectric layer 303 by using a patterning and metal deposition operation such as printing, PVD, sputtering, electrolytic plating, and electroless plating. The electrically conductive layer 306 may be one or more layers of Al, Cu, Sn, Ni, Au, Ag, or other suitable electrically conductive material. Accordingly, a conductive interconnect structure is formed. The conductive interconnect structure electrically connects the top dies 301 and the bottom wafer 302 through the electrically conductive layer 306 and the TSVs 304 and/or the TDVs 305.

Figure 3B:
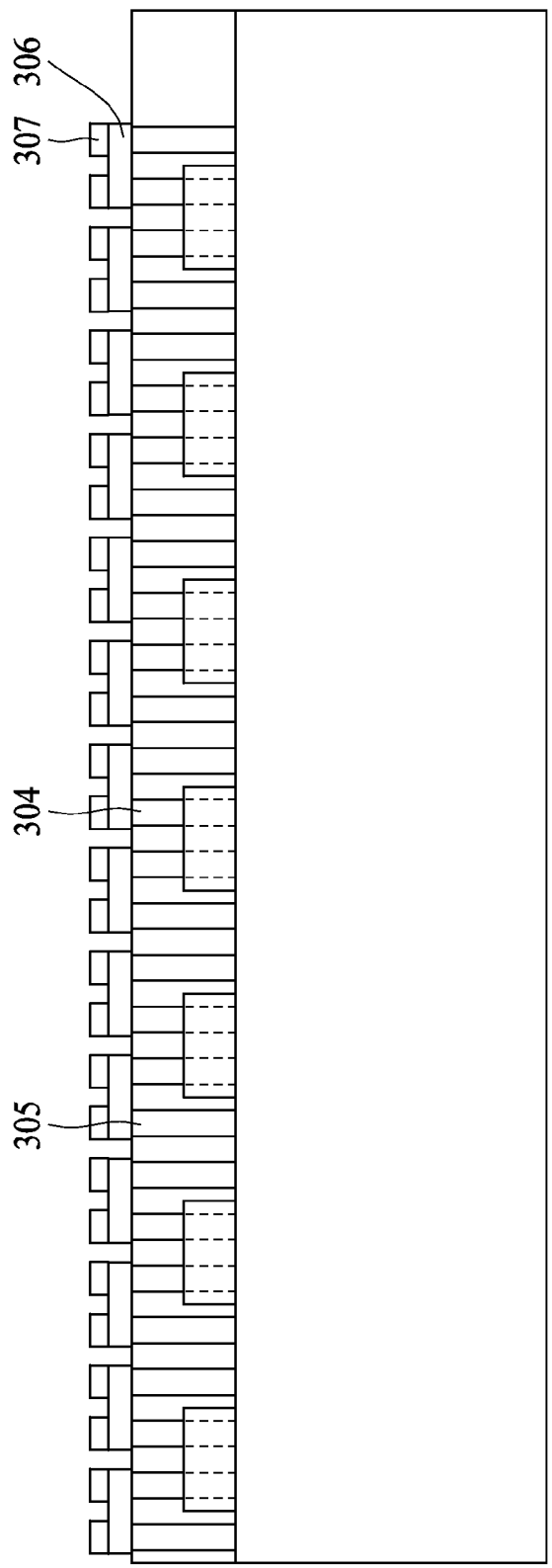

FIG. 3B illustrates that an under bump metallization (UBM) 307 can be formed on the electrically conductive layer 306. In order to improve the adhesion and reliability of the connection between the bumps and the electrically conductive layer, the UBM 307 may include an adhesion layer using either chromium (Cr), or titanium tungsten alloy (Ti—W) and a metal layer disposed on the adhesion layer using either copper, or chromium copper alloy (Cr—Cu).

Figure 3C:
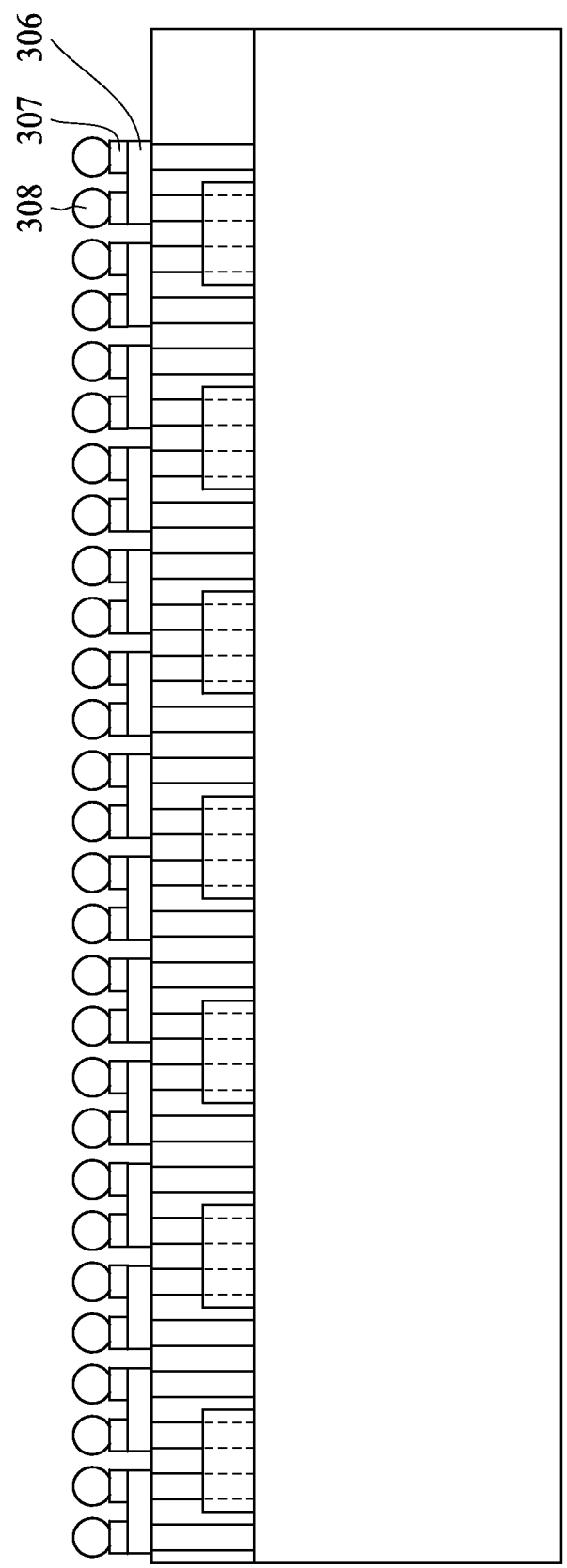

FIG. 3C illustrates that the bumps 308 are formed on the UBM 307. The bumps 308 can also be compressively-bonded to the electrically conductive layer 306. Each of the bumps 308 may be laterally offset from the corresponding conductive via by an offset distance or disposed directly on the corresponding conductive via. The bumps 308 represent one type of interconnect structure that can be formed over the electrically conductive layer 306. The interconnect structure can also use wire bonding, stud bump, micro bump, or other electrical interconnect.

Figure 4:
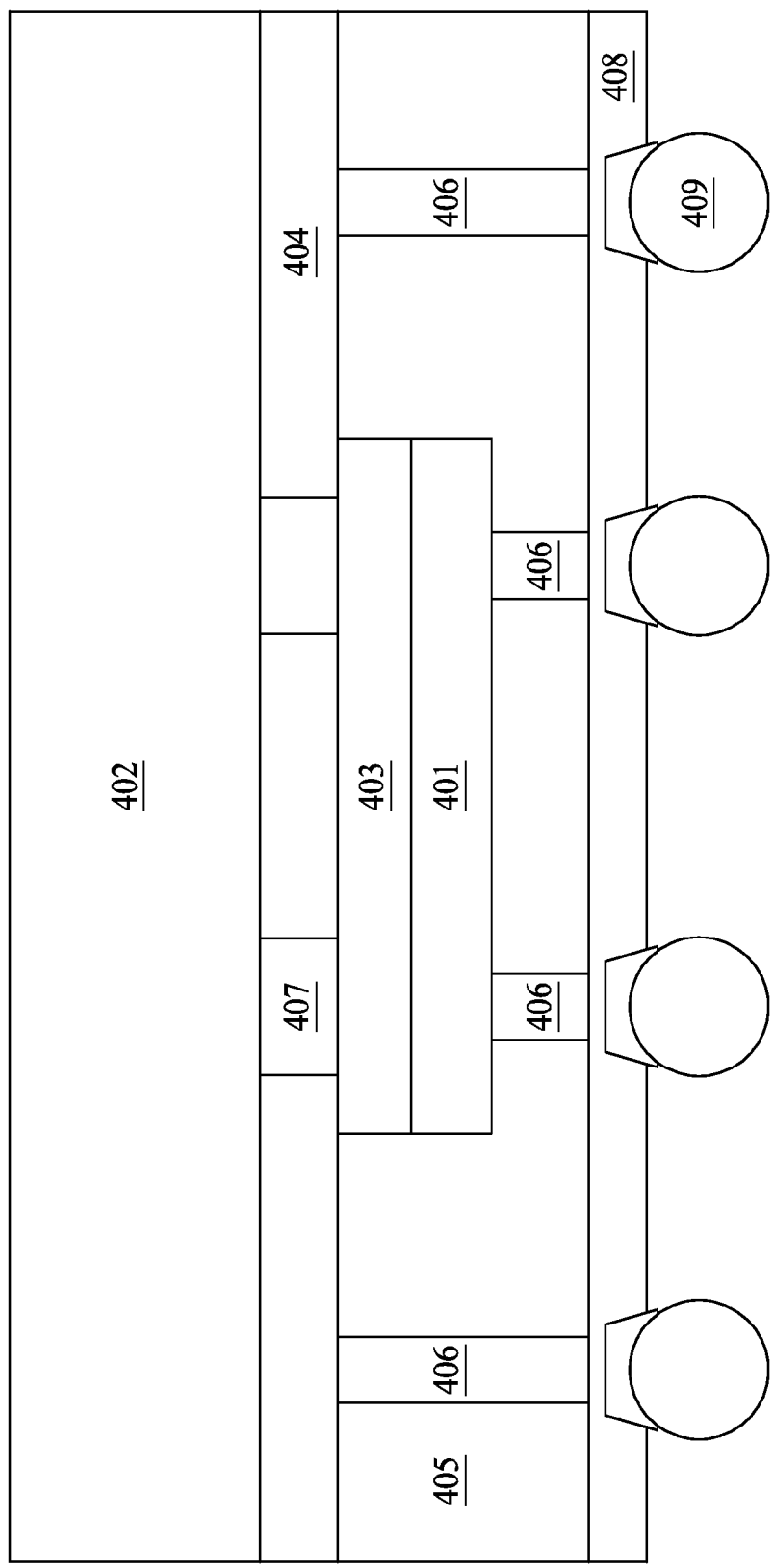
FIG. 4 illustrates a cross sectional view of a semiconductor device, in accordance with one embodiment of the present disclosure.

FIG. 4 shows a semiconductor device according to one embodiment of the present disclosure. The semiconductor device includes: a singulated top die 401 with a dielectric layer 403 disposed on a back side of the singulated top die 401; and a bottom wafer 402 with a dielectric layer 404 disposed on a front side of the bottom wafer 402. A plurality of pads 407 is formed on the bottom wafer 402 and surrounded by the dielectric layer 404. Each of the plurality of pads 407 has a conducting pattern and a lead connected to the conducting pattern for electrically connecting the devices in the FEOL layer of the bottom wafer 402 and the singulated top die 401. The back side of the singulated top die 401 is bonded to the front side of the bottom wafer 402. The back side of the singulated top die 401 which the dielectric layer 403 is disposed thereon is opposite to the front side the singulated top die 401 which an FEOL layer and a BEOL layer are disposed thereon. Before bonding the singulated top die 401 to the bottom wafer 402, the singulated top die 401 has to pass through die test. In order to improve high product yield, only the KGD can be selected to bond to the bottom wafer 402. The dielectric layers 403 and 404 may be selected from low-k materials, such as silicon oxide ($SiO_2$), silicon carbide (SiC), silicon oxynitride (SiON), and silicon carbonitride (SiCN). The dielectric layers 403 and 404 may be formed by CVD operations. A dielectric layer 405 is disposed to cover the front side of the singulated top die 401 and the front side of the bottom wafer 402. The dielectric layer 405 may be formed by spin-on operations. The material of the dielectric layer 405 may be spin-on glasses or spin-on polymers such as siloxanes, silicates, silazanes or silisequioxanes. Vias are formed in the dielectric layer 405 by single or multiple etching operations and filled with electrically conductive materials. In some embodiments, a portion of the vias is TSVs and a portion of the vias is TDVs. As illustrated in FIG. 4, the singulated top die 401 is electrically coupled to the bottom wafer through TDVs 406 only. In the case where only TDVs 406 are present in a semiconductor package, a TDV 406 adjacent to the singulated top die 401 is connected to another TDV 406 over the singulated top die 401 through electrically conductive layer 408. An electrically conductive layer 408 having bumps 409 and conductive patterns aligned relative to the bumps 409 thereon are disposed on the dielectric layer 405. TDVs 406 are surrounded by the dielectric layer 405. A portion of the TDVs 406 exposing from the singulated top die 401 is surrounded by the dielectric layer 405. A conductive interconnect structure is thus formed and used to electrically connect the singulated top die 401 and the bottom wafer 402 through the vias and the electrically conductive layer 408.

Figure 5:
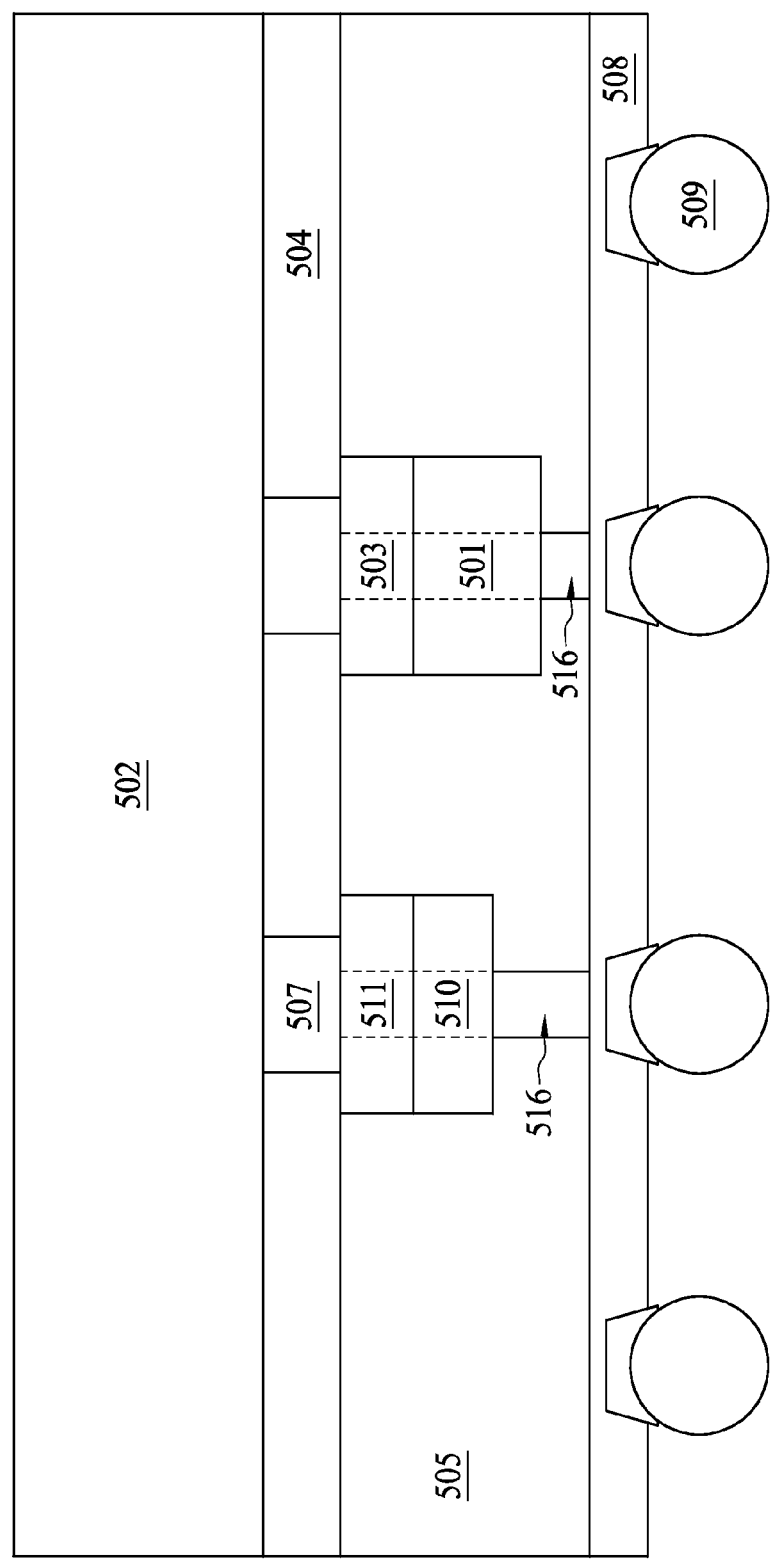
FIG. 5 illustrates a cross sectional view of a semiconductor device, in accordance with another embodiment of the present disclosure.

FIG. 5 shows a semiconductor device according to another embodiment. The semiconductor device includes: a singulated top die 501 with a dielectric layer 503; a singulated top die 510 with a dielectric layer 511; and a bottom wafer 502 with a dielectric layer 504. Each of the plurality of pads 507 has a conducting pattern and a lead connected to the conducting pattern for electrically connecting the devices in the FEOL layer of the bottom wafer 502 to the singulated top dies 501 and 510. The back sides of the singulated top dies 501 and 510 are bonded to the front side of the bottom wafer 502. The back sides of the singulated top dies 501 and 510 which the dielectric layers 503 and 511 are respectively disposed thereon are opposite to the front sides the singulated top dies 501 and 510 which FEOL layers and BEOL layers are respectively disposed thereon. The singulated top dies 501 and 510 may be identical type or different types of dies. In other words, the singulated top dies 501 and 510 may have identical structures, thicknesses and functions, or different structures, thicknesses and functions. Before bonding the singulated top dies 501 and 510 to the bottom wafer 502, the singulated top dies 501 and 510 have to pass through die test. In order to improve high product yield, only the KGDs are bonded to the bottom wafer 502. The dielectric layers 503, 504, and 511 may be selected from low-k materials, such as silicon oxide ($SiO_2$), silicon carbide (SiC), silicon oxynitride (SiON), and silicon carbonitride (SiCN). The dielectric layers 503, 504, and 511 may be formed by CVD operations. A dielectric layer 505 is disposed to cover the front side of the singulated top dies 501 and 510 and the front side of the bottom wafer 502. The dielectric layer 505 may be formed by spin-on operations. The material of the dielectric layer 505 may be spin-on glasses or spin-on polymers such as siloxanes, silicates, silazanes or silisequioxanes. Vias are formed in the dielectric layer 505 as well as through the top dies 501 and 510 by single or multiple etching operations and filled with electrically conductive materials. As illustrated in FIG. 5, the singulated top dies 501 and 510 are electrically coupled to the bottom wafer through TSVs 516 only. In the case where only TSVs 516 are present in a semiconductor package, one end of the TSV 516 is coupled to the bottom wafer 502 and the other end of the TSV 516 is connected to the bumps 509. An electrically conductive layer 508 having bumps 509 and conductive patterns aligned relative to the bumps 509 thereon is disposed on the dielectric layer 505 and the TSVs 516 can be partially surrounded by the dielectric layer 505. A conductive interconnect structure is thus formed and used to electrically connect the singulated top dies 501 and 510 and the bottom wafer 502 through the vias and the electrically conductive layer 508.

Figure 6:
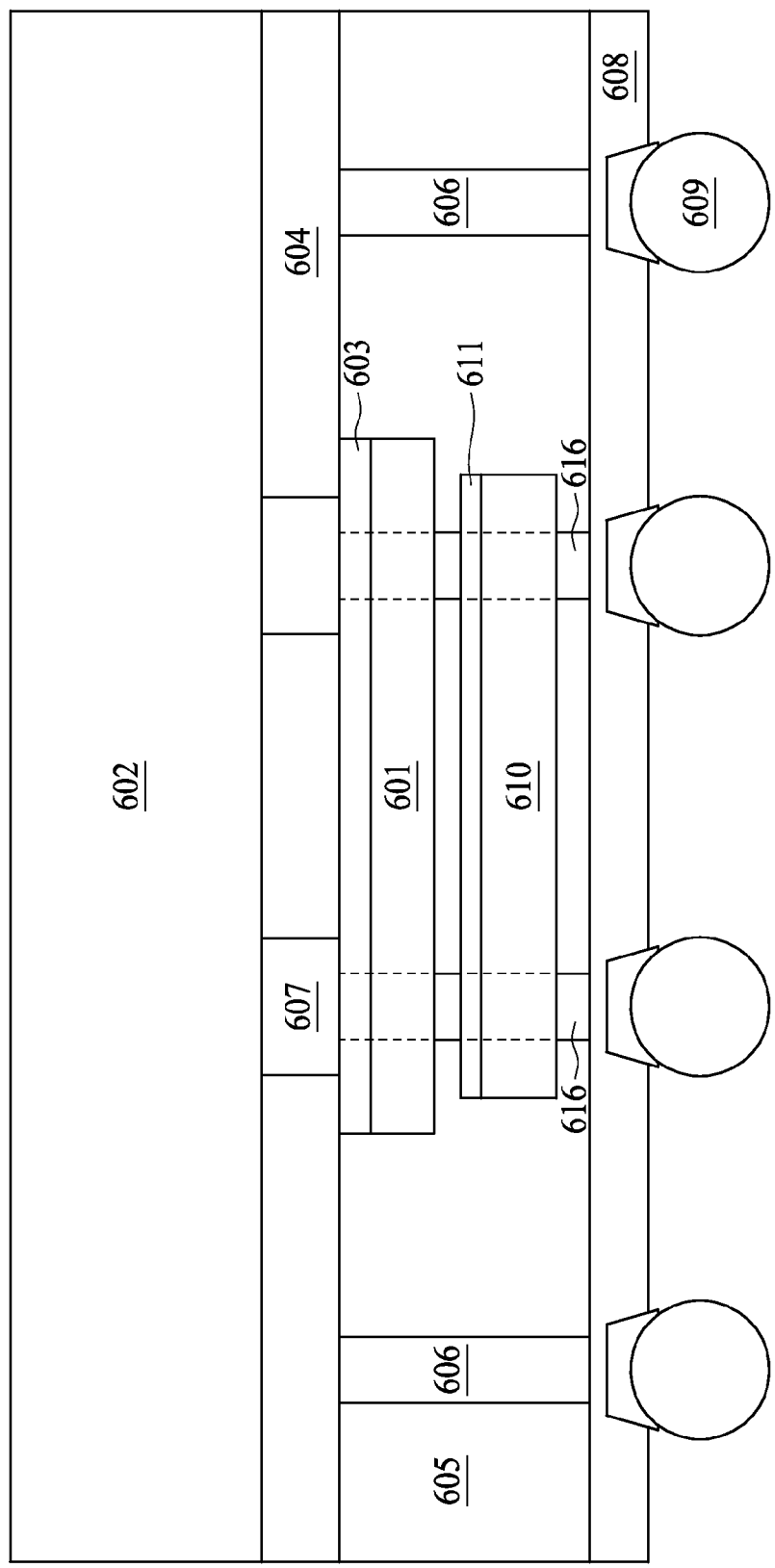
FIG. 6 illustrates a cross sectional view of a semiconductor device, in accordance with yet another embodiment of the present disclosure.

FIG. 6 shows a semiconductor device according to yet another embodiment. The semiconductor device includes: a singulated top die 601 with a dielectric layer 603; a singulated top die 610 with a dielectric layer 611; and a bottom wafer 602 with a dielectric layer 604. Each of the plurality of pads 607 has a conducting pattern and a lead connected to the conducting pattern for electrically connecting the devices in the FEOL layer of the bottom wafer 602 to the singulated top dies 601 and 610. The singulated top die 610 is stacked on the singulated top die 601, wherein the back side of the singulated top die 610 is faced with the front side of the singulated top die 601. The singulated top die 601 is bonded to the bottom wafer 602, wherein the back side of the singulated top die 601 is faced with the front side of the bottom wafer 602. The back sides of the singulated top dies 601 and 610 which the dielectric layers 603 and 611 are respectively disposed thereon are opposite to the front sides the singulated top dies 601 and 610 which FEOL layers and BEOL layers are respectively disposed thereon. The singulated top dies 601 and 610 may be identical type or different types of dies. In other words, the singulated top dies 601 and 610 may have identical structures, thicknesses and functions, or different structures, thicknesses and functions. Before bonding the singulated top dies 601 to the wafer 602 and bonding the singulated top die 610 to the singulated top die 601, the singulated top dies 601 and 610 have to pass through die test. In order to improve high product yield, only the KGDs are bonded to the bottom wafer 602. The dielectric layers 603, 604, and 611 may be selected from low-k materials, such as silicon oxide ($SiO_2$), silicon carbide (SiC), silicon oxynitride (SiON), and silicon carbonitride (SiCN). The dielectric layers 603, 604, and 611 generally may be formed by CVD operations. A dielectric layer 605 is disposed to cover the front side of the singulated top dies 601 and 610 and the front side of the bottom wafer 602. The dielectric layer 605 may be formed by spin-on operations. The material of the dielectric layer 605 may be spin-on glasses or spin-on polymers such as siloxanes, silicates, silazanes or silisequioxanes. Vias are formed in the dielectric layer 605 by single or multiple etching operations and filled with electrically conductive materials. A portion of the vias is TSVs 616 and a portion of the vias is TDVs 606. An electrically conductive layer 608 having bumps 609 and conductive patterns aligned relative to the bumps 609 thereon is disposed on the dielectric layer 605 and the vias surrounded by the dielectric layer 605. A conductive interconnect structure is thus formed and used to electrically connect the singulated top dies 601 and 610 and the bottom wafer 602 through the vias and the electrically conductive layer 608. As illustrated in FIG. 6, the singulated top dies 601 and 610 may be electrically coupled to the bottom wafer through TSVs 616 only or through TDVs 606 and TSVs 616. In the case where only TSVs 616 are present in a semiconductor package, one end of the TSV 616 is coupled to the bottom wafer 602 and the other end of the TSV 616 is connected to the bumps 609. In the case where TDVs 606 and TSVs 616 are present in a semiconductor package, TDVs 606 are connected to TSVs 616 through electrically conductive layer 608.

In accordance with some embodiments of the present disclosure, a method for manufacturing a semiconductor device includes: attaching a carrier wafer to a front side of a top wafer; thinning a back side of the top die wafer, the back side of the top die wafer being opposite to the front side the top die wafer; singulating the carrier wafer and the top die wafer whereby singulated dies attached to singulated carrier dies are formed; and bonding back side of each of the singulated dies to a front side of a bottom die wafer.

In accordance with some embodiments of the present disclosure, a method for manufacturing a semiconductor device includes: attaching a first carrier wafer to a front side of a first top die wafer; attaching a second carrier wafer to a front side of a second top die wafer; thinning a back side of the first top die wafer, the back side of the first top die wafer being opposite to the front side of the first top die wafer; thinning a back side of the second top die wafer, the back side of the second top die wafer being opposite to the front side of the second top die wafer; singulating the first and second carrier wafers and the first and second top die wafers whereby singulated first die on singulated first carrier die, and singulated second die on singulated second carrier die are formed; and electrically coupling the singulated first die and singulated second die to a front side of a bottom die wafer, the singulated first die being a different type of die from the singulated second die.

In accordance with some embodiments of the present disclosure, a semiconductor device includes: a singulated top die, a bottom die, a front side of the bottom die bonded to a back side of the singulated top die; a dielectric layer covering the front side of the bottom die and a front side of the singulated top die; a conductive layer on the dielectric layer, and a plurality of vias surrounded by the dielectric layer to electrically connect the singulated top die and the bottom die through the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, including:
    attaching a carrier wafer having a first wafer width to a front side of a die wafer having a second wafer width, the first wafer width being substantially identical to the second wafer width, the die wafer having a thickness of about 700 μm when attaching to the carrier wafer;
    thinning a back side of the die wafer, the back side of the die wafer being opposite to the front side of the die wafer;
    singulating the carrier wafer and the die wafer concurrently when die wafer having the second wafer width, whereby singulated dies attached to singulated carrier dies are formed; and
    bonding the singulated dies attached to singulated carrier dies to a bottom wafer, wherein a back side of each of the singulated dies is facing a front side of the bottom wafer.

2. The method of claim 1, further including:
    selecting known good dies before bonding the back sides of each of the singulated dies to the front side of the bottom wafer.

3. The method of claim 2, further including:
    removing the singulated carrier dies from the singulated dies.

4. The method of claim 2, further including:
    forming a dielectric layer on the front side of the bottom wafer and front sides of the singulated dies.

5. The method of claim 4, further including:
    forming vias in the dielectric layer; and
    forming an electrically conductive layer on the dielectric layer connecting the vias so that the bottom wafer is electrically connected to the front side of the singulated dies.

6. The method of claim 5, further including forming bumps with under bump metallization on the conductive layer.

7. The method of claim 4, wherein the dielectric layer is formed by spinning dielectric materials to cover the front side of the bottom wafer and the front sides of the singulated dies.

8. The method of claim 1, wherein the bottom wafer comprises an inter poser or a device wafer.

9. A method for manufacturing a semiconductor device, including:
    attaching a first carrier wafer having a first wafer width to a front side of a first top die wafer having a second wafer width, the first wafer width being substantially identical to the second wafer width, the first top die wafer having a thickness of about 700 μm when attaching to the first carrier wafer;
    attaching a second carrier wafer to a front side of a second top die wafer;
    thinning a back side of the first top die wafer, the back side of the first top die wafer being opposite to the front side of the first top die wafer;
    thinning a back side of the second top die wafer, the back side of the second top die wafer being opposite to the front side of the second top die wafer;
    singulating the first and second carrier wafers and the first and second top die wafers concurrently when the first top die wafer having the second wafer width, whereby singulated first die on singulated first carrier die, and singulated second die on singulated second carrier die are formed; and
    electrically coupling the singulated first die on singulated first carrier die and singulated second die on singulated second carrier die to a front side of a bottom wafer, the singulated first die being a different type of die from the singulated second die.

10. The method of claim 9, further including:
    selecting known good dies before bonding the singulated first die and the singulated second die to the front side of the bottom wafer.

11. The method of claim 10, wherein a back side of the singulated first die and a back side of the singulated second die are directly bonded to the front side of the bottom wafer.

12. The method of claim 11, further including:
    forming a dielectric layer covering the front side of the bottom wafer and the front side of the singulated first die and that of the singulated second die.

13. The method of claim 12, further including:
    forming vias in the dielectric layer; and
    forming a conductive layer connecting the vias on the dielectric layer so that the bottom wafer is electrically connected to the singulated first die and the singulated second die.

14. The method of claim 9, wherein a thickness of the singulated first die is different from a thickness of the singulated second die.

15. The method of claim 12, further including:
    forming vias through the singulated first die; and
    forming a conductive layer on the dielectric layer and connecting the vias so that the bottom wafer is electrically connected to the singulated first die.

16. The method of claim 10, wherein a back side of the singulated second die is in contact with a front side of the singulated first die, and a back side of the singulated first die is in contact with the front side of the bottom wafer.

17. A method for manufacturing a semiconductor device, including:
    attaching a carrier wafer having a first wafer width to a front side of a first die wafer having a second wafer width, the first wafer width being substantially identical to the second wafer width, the first die wafer having a thickness of about 700 μm while attaching to the carrier wafer;
    thinning a back side of the first die wafer, the back side of the first die wafer being opposite to the front side of the first die wafer;
    singulating the carrier wafer and the first die wafer concurrently when the first die wafer having the second wafer width, whereby singulated first dies attached to singulated carrier dies are formed; and attaching the back side of each of the singulated first dies to a second wafer.

18. The method of claim 17, wherein the thinning the back side of the first die wafer comprising performing a chemical mechanical polishing until a thickness below 25 µm is reached.

19. The method of claim 17, further comprising:

removing the singulated carrier dies from the singulated first dies thereby exposing front sides of the singulated first dies;

forming a dielectric layer covering the front side of the second wafer and front sides of the singulated first dies; and forming through dielectric vias in the dielectric layer and through silicon vias in the singulated first dies.

20. The method of claim 17, further comprising:

selecting known good dies from the singulated first dies before attaching the back sides of each of the singulated first dies to the front side of the second wafer.

* * * * *